(12) United States Patent
Koester et al.

(10) Patent No.: US 12,550,680 B2
(45) Date of Patent: Feb. 10, 2026

(54) METHOD FOR TESTING THE STRESS ROBUSTNESS OF A SEMICONDUCTOR SUBSTRATE

(71) Applicant: SILTRONIC AG, Munich (DE)

(72) Inventors: Ludwig Koester, Burghausen (DE); Alexander Vollkopf, Burghausen (DE); Mitsunori Komoda, Burghausen (DE)

(73) Assignee: SILTRONIC AG, Munich (DE)

( * ) Notice: Subject to any disclaimer, the term of this patent is extended or adjusted under 35 U.S.C. 154(b) by 385 days.

(21) Appl. No.: 18/264,252

(22) PCT Filed: Feb. 4, 2022

(86) PCT No.: PCT/EP2022/052733
§ 371 (c)(1),
(2) Date: Aug. 4, 2023

(87) PCT Pub. No.: WO2022/175115
PCT Pub. Date: Aug. 25, 2022

(65) Prior Publication Data
US 2024/0105523 A1     Mar. 28, 2024

(30) Foreign Application Priority Data
Feb. 16, 2021 (EP) .................................. 21157381

(51) Int. Cl.
*H01L 21/66* (2006.01)
*H01L 21/311* (2006.01)
*H01L 21/324* (2006.01)

(52) U.S. Cl.
CPC ......... *H01L 22/12* (2013.01); *H01L 21/31116* (2013.01); *H01L 21/324* (2013.01)

(58) Field of Classification Search
CPC ................ H01L 21/22; H01L 21/0217; H01L 21/31116; H01L 21/324
See application file for complete search history.

(56) References Cited

U.S. PATENT DOCUMENTS

2004/0137752 A1   7/2004  Sugamoto et al.
2008/0099781 A1   5/2008  Choi et al.
(Continued)

FOREIGN PATENT DOCUMENTS

EP    2959500 B1      2/2019
EP    4044216 A1 *    8/2022    ............. H01L 22/12
(Continued)

OTHER PUBLICATIONS

Ohta et al., Proposal of Prediction Method for Dislocation Generation in Silicon Substrates for Semiconductor Devices, J. Soc. Mat. Sci. Japan, Journal Materials Science Research International, revised Mar. 1996, pp. 1322-1327, vol. 45, No. 12, Elsevier.
(Continued)

*Primary Examiner* — Mary A Wilczewski
(74) *Attorney, Agent, or Firm* — LEYDIG, VOIT & MAYER, LTD.

(57) ABSTRACT

A method tests the stress robustness of a semiconductor substrate. The method includes: forming a nitride layer on a surface of the semiconductor substrate, the nitride layer being directly deposited on the surface of the semiconductor substrate or on a native oxide layer that is interposed on the surface; cooling the semiconductor substrate and the nitride layer; patterning the nitride layer into a patterned nitride by photolithography including a step of reactive ion etching with ions produced from a gas, which includes hydrogen or a hydrogen compound or both; processing the patterned nitride and the semiconductor substrate at a temperature of not less than 800° C. and not more than 1300° C. in a nitrogen atmosphere to induce the formation of dislocations at an interface between the patterned nitride and the semiconductor substrate; and evaluating at least one property that is related to the formed dislocations.

7 Claims, 2 Drawing Sheets

(56) References Cited

U.S. PATENT DOCUMENTS

| | | |
|---|---|---|
| 2012/0241755 A1 | 9/2012 | Romanov et al. |
| 2020/0273711 A1 | 8/2020 | Yoshida et al. |
| 2024/0105523 A1* | 3/2024 | Koester .................. H01L 22/12 |
| 2024/0219829 A1* | 7/2024 | Baskaran ................ G03F 7/168 |

FOREIGN PATENT DOCUMENTS

| | | | |
|---|---|---|---|
| JP | H05315443 A | 11/1993 | |
| JP | 2004179638 A | 6/2004 | |
| JP | 2006213584 A | 8/2006 | |
| JP | 2009277774 A | 11/2009 | |
| JP | 2018006708 A | 1/2018 | |
| WO | WO-2022175115 A1 * | 8/2022 | ............. H01L 22/12 |

OTHER PUBLICATIONS

Ikeda et al., Mechanical stress control in a VLSI-Fabrication Process: A method for Obtaining the Relation Between Stress Levels and Stress-Induced Failures, IEEE Transactions on Semiconductor Manufacturing, Nov. 2003, pp. 696-703, vol. 16, No. 4, IEEE, ISSN: 0894-6507.

* cited by examiner

METHOD FOR TESTING THE STRESS ROBUSTNESS OF A SEMICONDUCTOR SUBSTRATE

CROSS REFERENCE TO RELATED APPLICATIONS

This application is a U.S. National Phase application under 35 U.S.C. § 371 of International Application No. PCT/EP2022/052733, filed on Feb. 4, 2022, and claims benefit to European Patent Application No. EP 21157381.1, filed on Feb. 16, 2021. The International Application was published in English on Aug. 25, 2022 as WO 2022/175115 A1 under PCT Article 21(2).

FIELD

The present disclosure concerns a method for testing the stress robustness of a semiconductor substrate.

BACKGROUND

Advanced device processing may stress the semiconductor substrate to a higher degree. Three dimensional (3D)-structures, such as finfets, but also extreme heat treatments may cause localized stress fields and induce mechanical damage, such as plastic deformation in the substrate. Plastic deformation, in turn, can adversely affect device pattern overlay and electrical device performance. Therefore, it is important to know, how a substrate will behave in a device manufacturing process in terms of mechanical robustness and overlay performance, respectively. A reliable test that simulates the device manufacturing process with reduced complexity allows the development of robust semiconductor substrates. Existing tests, such as indenter tests create a significant mechanical damage that penetrates several microns into the substrate.

EP 2 959 500 B1, for example, refers to a stress test comprising a mechanical damage of the substrate wafer with an indenting tool followed by a thermal treatment. A drawback of this test is the introduction of a deep crystal lattice damage and plastic deformation, untypical for a semiconductor device process. In addition, an indent only provides a very localized information on the substrate properties, but not over the full semiconductor wafer.

SUMMARY

In an embodiment, the present disclosure provides a method that tests the stress robustness of a semiconductor substrate. The method includes: forming a nitride layer on a surface of the semiconductor substrate, the nitride layer being directly deposited on the surface of the semiconductor substrate or on a native oxide layer that is interposed on the surface; cooling the semiconductor substrate and the nitride layer; patterning the nitride layer into a patterned nitride by photolithography including a step of reactive ion etching with ions produced from a gas which includes hydrogen or a hydrogen compound or both; processing the patterned nitride and the semiconductor substrate at a temperature of not less than 800° C. and not more than 1300° C. in a nitrogen atmosphere to induce the formation of dislocations at an interface between the patterned nitride and the semiconductor substrate; and evaluating at least one property that is related to the formed dislocations.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following:

FIG. 2 displays some forms the nitride pattern may be composed of; and

DETAILED DESCRIPTION

Figure 1:
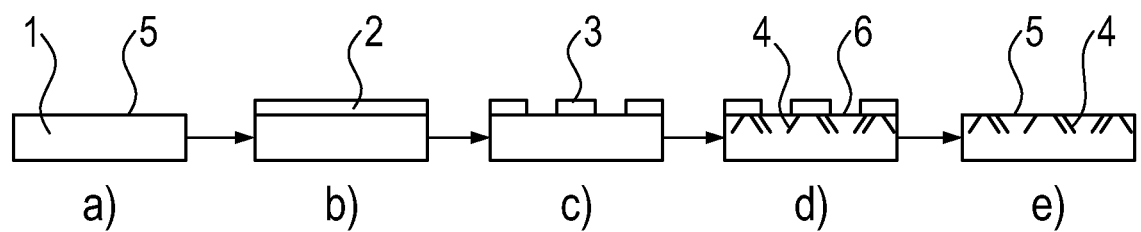
FIG. 1 schematically depicts a possible flow of individual steps of a method according to the present disclosure.

Aspects of the present disclosure provide an alternative method for testing stress robustness that avoids the need of mechanically indenting the substrate wafer. The advantage of embodiments of the present disclosure is to be very similar to device processes, relaying on pure film induced mechanical near surface stress and can reveal robustness information over the complete wafer surface.

An aspect of the present disclosure provides a method for testing the stress robustness of a semiconductor substrate, the method comprising:
forming a nitride layer on a surface of the semiconductor substrate;
patterning the nitride layer into a patterned nitride by photolithography including a step of reactive ion etching with ions produced from a gas which comprises hydrogen or a hydrogen compound or both;
processing the patterned nitride and the semiconductor substrate at a temperature of not less than 800° C. and not more than 1300° C. to induce the formation of dislocations at an interface between the patterned nitride and the semiconductor substrate; and
evaluating at least one property that is related to the formed dislocations.

The present disclosure provides a test that is focused on the near surface area where the devices are located without causing mechanical damage as origin of the stress. The test allows a simple simulation of a device manufacturing process with the focus on the mechanical robustness of the semiconductor substrate with respect to dislocation formation. Semiconductor substrates with reduced dislocation formation rate or dislocation propagation within the test structures will perform with a higher yield in the device manufacturing process. The test allows the development and production of semiconductor substrates with improved mechanical robustness as it is closer to a real device manufacturing process and does not cause severe mechanical damage as origin of the stress.

As the method lacks mechanical indentation and focuses on the near surface area where electronic devices will be formed, a more realistic picture of the stress robustness of the semiconductor substrate may be obtained. The test is focused on the near surface area where the electronic devices are located and allows the identification of semiconductor substrates having improved stress robustness. Dislocation defects in device processing can often only be detected inline or even in the back end when devices are being tested with respect to electrical performance. The test allows simulating the most critical device processes already during semiconductor substrate development before devices are being processed on the wafers in high volume production.

The method induces the formation of dislocations in the near surface area and uses at least one property that is related to the dislocations for quantifying the stress robustness of the semiconductor substrate.

The dislocations are induced by means of a thermal treatment at an interface between a surface of the substrate and a patterned nitride formed on the surface. After the thermal treatment of the semiconductor substrate and the patterned nitride, the patterned nitride may be removed and the at least one property related to the formed dislocations is examined.

Before forming a patterned nitride, a nitride layer, e.g. a silicon nitride layer, is directly deposited on the surface of the semiconductor substrate without a further layer like an oxide layer being interposed. However, as an exception, a native oxide layer may be present between the nitride layer and the semiconductor substrate. Preferably, the nitride layer has a uniform thickness. The direct deposition of the nitride layer provides significant mechanical stress between the layer and the substrate material, caused by different thermal expansion coefficients between substrate and nitride layer during cooling after layer deposition. The nitride layer may be deposited, for example, by means of LPCVD (low pressure chemical vapor deposition) at elevated temperature between 700 degrees ° C. and 800 degrees ° C. The nitride layer may have a thickness of not less than 150 nm and not more than 400 nm. Before the deposition of the nitride layer, the semiconductor substrate may be subjected to a thermal pre-treatment, e.g. at conditions specific for electronic device manufacturing processes.

Next to the deposition of the nitride layer, the nitride layer is transformed into a patterned nitride by photolithography including a step, where a patterned photoresist is formed on the nitride layer and nitride is removed at positions free of photoresist by RIE (reactive ion etching). The patterned nitride may comprise nitride structures having forms like lines, circles, squares and rectangles. Lines, squares and rectangles may laterally extend over a distance from 100 μm to several mm. Circles may have an outer diameter from 100 μm to 5000 μm. Preferably, the line width of the nitride structures may be from 5 μm to 1000 μm. Adjacent nitride structures may be spaced from each other by distances in the range of from 10 μm to several mm. In order to generate the plasma with ions for RIE, a gas is used that comprises hydrogen or a hydrogen compound or both, for example a mixture of $CHF_3$, $CF_4$ and argon or oxygen. The presence of hydrogen may create a subsurface damage that triggers the formation of dislocations during a subsequent thermal treatment.

After the patterned nitride has been formed, the photoresist is removed, and the semiconductor substrate and the patterned nitride is subjected to a subsequent thermal treatment that is performed either in an RTP (rapid thermal processing) tool or in a batch furnace. The thermal treatment may be performed in a nitrogen atmosphere and causes the formation of dislocations, which start at an edge position of the interface between the semiconductor substrate and the patterned nitride. The temperature of the thermal treatment may range from 800° C.-1300° C. and affects the dynamics of dislocation propagation. In case that RTP is used, the ramp rate may be from 10° C./s to 100° C./s and the semiconductor substrate and the patterned nitride may be annealed for a period of 1 min to 10 min or more at the target temperature. The thermal treatment in a batch furnace may last from 15 min to 3 hours or more.

Next, the patterned nitride may be removed from the semiconductor substrate and at least one property that is related to the formed dislocations is evaluated. The at least one property may be, for example, the density of dislocations at a position on the surface of the semiconductor substrate which was buried under nitride during the thermal treatment. The higher the mechanical robustness of the semiconductor material is, the lower the dislocation density will be. The dislocation density is highest at positions which have been edge positions during the thermal treatment and decreases with increasing distance from the nitride edge. Due to the high dislocation density at former edge positions, the dislocation density may be evaluated at positions which are located with an offset of at least 1 μm apart from former edge positions. The at least one property that is related to the formed dislocations may be, for example, the dislocation propagation length. It marks the distance to the nearest former edge position, where the dislocation density has decreased to a low threshold near or at zero. The higher the mechanical robustness of the semiconductor material is, the smaller the dislocation propagation length will be.

The at least one property that is related to the formed dislocations may be evaluated with or without a previous removal of the patterned nitride. The patterned nitride may be removed, and the semiconductor substrate may be etched in order to delineate dislocations. This defect etching may be performed, for example, with Wright etchant, and may be followed by an evaluation using optical or scanning electron microscopy. For example, a microscopic image may be taken from the etched front surface of the semiconductor substrate and defects may be automatically counted by using an evaluation software, so that the respective dislocation-related property may be calculated. Alternatively, removing the patterned nitride and subsequent etching may be omitted and XRT (x-ray topography) or PL (photoluminescence analysis) may be used for the evaluation of the at least one property that is related to the formed dislocations. A PL mapper is also able to evaluate the penetration depth of the dislocations into the bulk of the semiconductor substrate.

The semiconductor substrate may be, for example, a polished silicon wafer manufactured from a single crystal, an epitaxial wafer comprising such silicon wafer and a silicon epitaxial layer deposited thereon, or an SOI (silicon on insulator) wafer. In case of a (100)-oriented silicon single crystal lattice, the induced dislocations also propagate into the crystal bulk, namely along (111)-oriented planes, which cross the (100)-oriented surface at an angle of about 55°.

In accordance with FIG. 1, a method according to an aspect of the present disclosure may start with an optional step a), where the semiconductor substrate is subjected to a thermal pre-treatment. For example, the semiconductor substrate may be heated under conditions specified by a device manufacturing process condition.

A step b) of the method comprises the deposition of a nitride layer 2 on a surface 5 of the semiconductor substrate. The surface 2 is the top end of an area of the substrate wafer, in which electronic devices are intended to be built-in. Usually, surface 5 is the front surface of the semiconductor substrate 1.

During step c), a patterned nitride 3 is formed by means of a lithographic process, wherein the nitride layer 2 is partly removed by ME leaving the patterned nitride 3. A gas including hydrogen or a hydrogen compound or both is used as source for generating the plasma.

The following step d) comprises a thermal treatment of the semiconductor substrate 1 and the patterned nitride 3 at a temperature in the range of from 800° C. to 1300° C., either in a furnace, e.g. a batch furnace, or in an RTP tool. The thermal treatment in connection with the mechanical stress between the material of the substrate 1 and the material of the patterned nitride 3 induces the formation of dislocations 4 under the patterned nitride 3. Starting from an edge position 6, i.e. the lateral boundary of the patterned nitride 3, dislocations 4 extending to a certain depth of the semiconductor substrate 1 laterally propagate under the patterned nitride 3.

Next, during step e) the patterned nitride 3 may be removed from the surface 5 of the semiconductor substrate 1 and at least one property that is related to the formed dislocations 4 is evaluated in an area that was covered by the nitride structure 3 during the thermal treatment.

Figure 2:
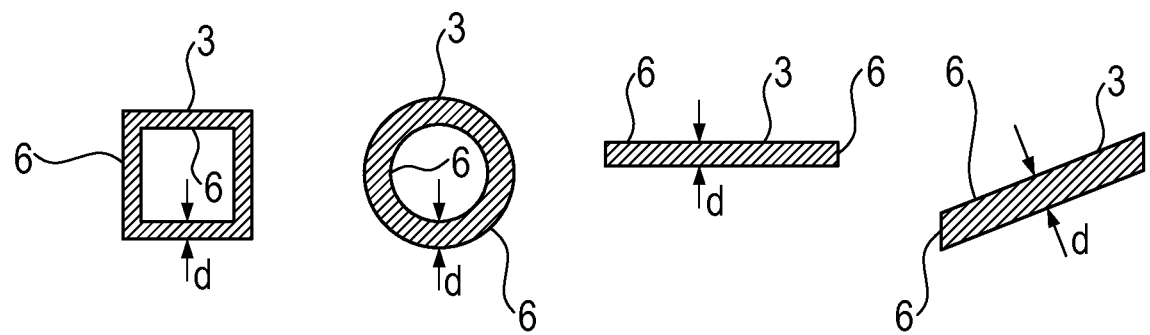

As shown in FIG. 2, the patterned nitride 3 may have forms like squares, circles, straight lines or tilted lines having a certain line width d. During the thermal treatment dislocations are formed in the edge positions 6 and laterally propagate under the patterned nitride 3.

EXAMPLES

Figure 3:
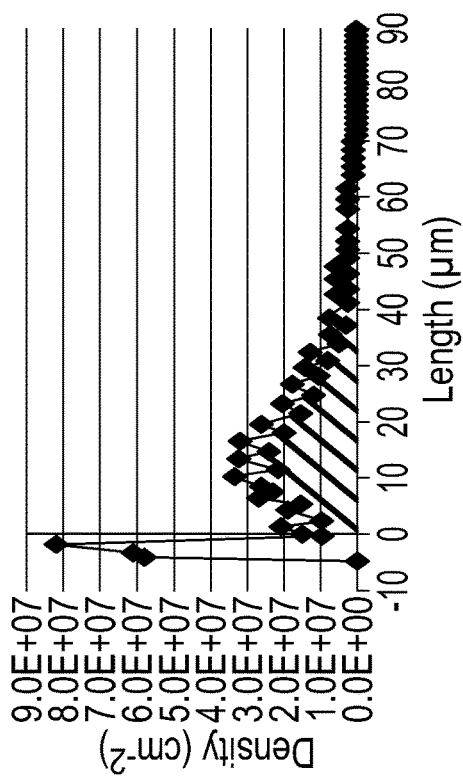
FIG. 3 shows an example of the evaluation of dislocation-related properties during step e) of FIG. 1.
Figure 3:
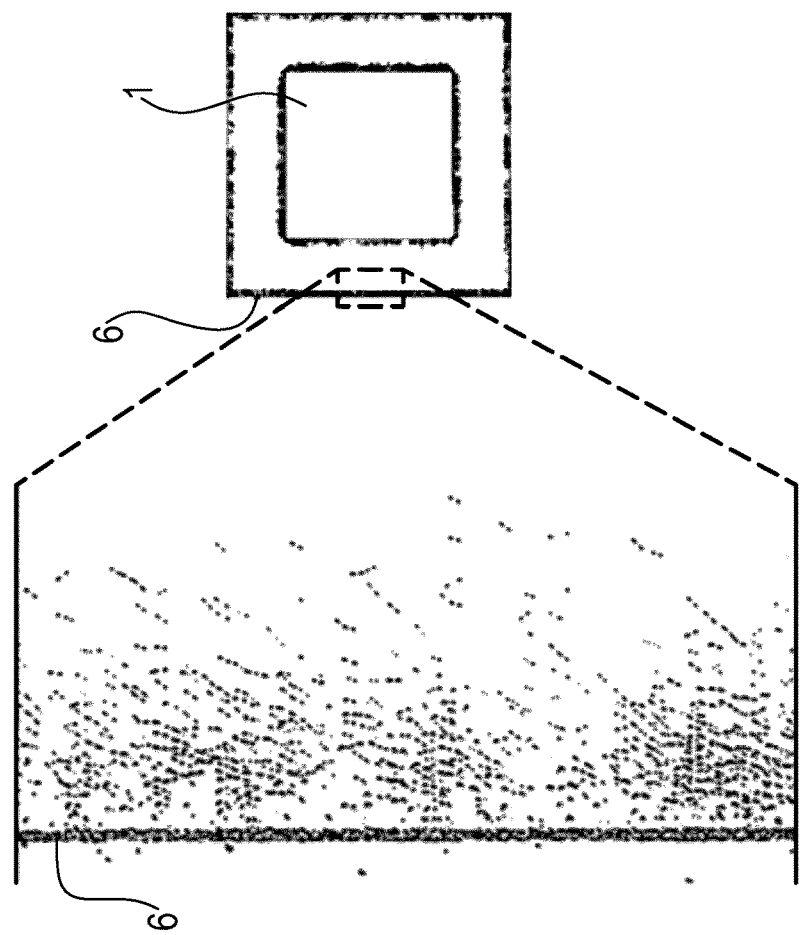

The centre part of FIG. 3 shows an optical microscope image of the area around a squared nitride structure after the removal of the patterned nitride from a silicon single crystal wafer, which was used as semiconductor substrate, and after the treatment of the silicon wafer with Wright etchant. The highest dislocation densities are located at and near the edge positions 6. The left part of FIG. 3 represents an enlarged view of the area marked with a hatched rectangle in the centre part. This area was evaluated for dislocation-related properties, namely, the dislocation density and the dislocation propagation length.

The right part of FIG. 3 is a diagram where the calculated dislocation density is plotted as a function of the distance from the edge position with an offset to exclude comparatively high dislocation densities at and near the edge positions. The maximum density was found at a distance of about 1 µm and the dislocation propagation length was about 75 µm.

Different semiconductor substrates were tested according to steps b) to e) of FIG. 1 and the test results are summarized in the following table. The patterned nitride formed during step c) had squared shaped forms and a thickness of 250 nm. The thermal treatment during step d) was performed as RTP at a temperature of 1000° C. and the dislocation density (dd) and dislocation propagation length (dpl) were evaluated during step e). Polished silicon single crystal wafers with diameters of 300 mm were used as semiconductor substrates, either p-doped with a high resistivity of 20 Ohmcm or more (p$^-$) or p-doped with a low resistivity of 10 mOhmcm or less (p$^+$), or such wafers with a p-doped silicon epitaxial layer deposited thereon (pp$^-$ and pp$^+$ wafers). The influence of the concentration of interstitial oxygen (Oi) was examined by varying the oxygen concentration between low Oi ($1.8 \times 10^{17}$ atoms/cm$^3$, new ASTM F121) and high Oi ($5.8 \times 10^{17}$ atoms/cm$^3$).

TABLE

|  | p$^-$, low Oi | p$^-$, high Oi | p$^+$ | pp$^-$ | pp$^+$ |
|---|---|---|---|---|---|
| dd [cm$^{-2}$] | $4.2 \times 10^6$ | $5.3 \times 10^6$ | <1 | $9.9 \times 10^6$ | $6.9 \times 10^5$ |
| dpl [µm] | 122.0 | 55.5 | <1 | 77.5 | 25.5 |

A higher bulk oxygen level reveals a higher mechanical robustness which can be seen in a reduced dislocation propagation length. Similarly, the concentration of p-type dopant may be used for controlling the mechanical robustness, as well. Moreover, it was found that if the temperature during the thermal treatment increases from 900° C. to 1000° C., the dislocation density and the dislocation propagation length increases. Similarly, if the thickness of the nitride structure increases from 250 nm to 320 nm, the dislocation density and dislocation propagation length increases, as well. Finally, the reproducibility of the test in regard of both, the dislocation density and the dislocation propagation length, could be confirmed.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS EMPLOYED 1 semiconductor substrate
2 nitride layer
3 patterned nitride
4 dislocations
5 surface
6 edge position

The invention claimed is:

1. A method for testing the stress robustness of a semiconductor substrate, the method comprising:
   forming a nitride layer on a surface of the semiconductor substrate, the nitride layer being directly deposited on the surface of the semiconductor substrate or on a native oxide layer that is interposed on the surface;
   cooling the semiconductor substrate and the nitride layer;
   patterning the nitride layer into a patterned nitride by photolithography including a step of reactive ion etching with ions produced from a gas which comprises hydrogen or a hydrogen compound or both;
   processing the patterned nitride and the semiconductor substrate at a temperature of not less than 800° C. and not more than 1300° C. in a nitrogen atmosphere to induce the formation of dislocations at an interface between the patterned nitride and the semiconductor substrate; and evaluating at least one property that is related to the formed dislocations.

2. The method according to claim 1, wherein the gas consists of a mixture of $CHF_3$, $CF_4$ and argon.

3. The method according to claim 1, the method further comprising:
   using x-ray topography or photoluminescence analysis for evaluating the at least one property that is related to the formed dislocations.

4. The method according to claim 1, the method further comprising:
   evaluating the at least one property that is related to the formed dislocations by optical or scanning electron microscopy, and
   before evaluating the at least one property that is related to the formed dislocations, removing the patterned nitride from the semiconductor substrate and performing a delineation etch.

5. The method according to claim 1, the method further comprising:
   using a rapid thermal process or a batch furnace process for processing the patterned nitride and the semiconductor substrate.

6. The method according to claim 1, wherein the at least one property that is related to the formed dislocations is a dislocation density and/or a dislocation propagation length.

7. The method according to claim 1, wherein the gas consists of a mixture of $CHF_3$, $CF_4$ and oxygen.

* * * * *